US008988875B2

(12) United States Patent  
Gu et al.

(10) Patent No.: US 8,988,875 B2  
(45) Date of Patent: Mar. 24, 2015

(54) DISPLAY DEVICE

(75) Inventors: Yubo Gu, Shenzhen (CN); Liuyang Yang, Shenzhen (CN); Pei Jia, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 320 days.

(21) Appl. No.: 13/701,019

(22) PCT Filed: Sep. 7, 2012

(86) PCT No.: PCT/CN2012/081132  
§ 371 (c)(1),  
(2), (4) Date: Nov. 30, 2012

(87) PCT Pub. No.: WO2014/032332  
PCT Pub. Date: Mar. 6, 2014

(65) Prior Publication Data  
US 2014/0055917 A1    Feb. 27, 2014

(30) Foreign Application Priority Data  
Aug. 27, 2012  (CN) .......................... 2012 1 0307718

(51) Int. Cl.  
| G06F 1/16 | (2006.01) |
| H05K 5/00 | (2006.01) |
| H05K 5/02 | (2006.01) |

(52) U.S. Cl.  
CPC ............. *H05K 5/0017* (2013.01); *H05K 5/02* (2013.01)  
USPC ............ 361/679.55; 361/679.21; 361/679.22; 349/58

(58) Field of Classification Search  
CPC ................................. H05K 5/0017; H05K 5/02  
See application file for complete search history.

(56) References Cited

U.S. PATENT DOCUMENTS

| 5,729,310 | A  | * | 3/1998  | Horiuchi et al. ................. 349/62 |
| 6,016,175 | A  | * | 1/2000  | Kim ................................. 349/58 |
| 6,741,299 | B2 | * | 5/2004  | Fukayama et al. .............. 349/58 |
| 6,897,912 | B2 | * | 5/2005  | Kawakami et al. ............. 349/61 |
| 7,083,318 | B2 | * | 8/2006  | Ha et al. ......................... 362/633 |
| 7,218,521 | B2 | * | 5/2007  | Kim ............................... 361/704 |
| 7,810,984 | B2 | * | 10/2010 | Cha et al. ........................ 362/634 |
| 8,120,722 | B2 | * | 2/2012  | Jung et al. ....................... 349/58 |
| 8,797,245 | B2 | * | 8/2014  | Ito et al. .......................... 345/87 |
| 2004/0062057 | A1 | * | 4/2004 | Ha et al. ......................... 362/561 |
| 2005/0062902 | A1 | * | 3/2005 | Fukayama ...................... 349/58 |
| 2005/0117086 | A1 | * | 6/2005 | Sugahara et al. ............... 349/58 |
| 2005/0151894 | A1 | * | 7/2005 | Katsuda et al. ................. 349/58 |
| 2005/0243238 | A1 | * | 11/2005 | Cha et al. ....................... 349/58 |
| 2006/0238446 | A1 | * | 10/2006 | Takahashi et al. ............. 345/55 |
| 2008/0170170 | A1 | * | 7/2008  | Jung et al. ....................... 349/58 |
| 2008/0297999 | A1 | * | 12/2008 | Choi .............................. 361/681 |

(Continued)

*Primary Examiner* — David M Sinclair  
*Assistant Examiner* — Robert Brown

(57) ABSTRACT

A display device comprises a rear cover, a display panel, a drive device, a first adhesive member, a second adhesive member, an upper end guide frame, and a lower end guide frame, the rear cover includes a bottom wall, an upper end sidewall, an upper end coupling portion, an upper end support portion, a lower end sidewall, a lower end coupling portion, and a lower end support portion; the drive device is coupled at its upper end to the upper end support portion, and at its lower end to the lower end support portion; the first adhesive member bonds the upper end of the display panel to the upper end coupling portion, and the upper end guide frame is arranged between the display panel and the upper end of the drive device; the second adhesive member bonds the lower end of the display panel to the lower end guide frame.

20 Claims, 4 Drawing Sheets

(56) References Cited

U.S. PATENT DOCUMENTS

| | | | |
|---|---|---|---|
| 2009/0058235 A1* | 3/2009 | Uchimi | 312/114 |
| 2009/0122475 A1* | 5/2009 | Kim | 361/679.21 |
| 2009/0257207 A1* | 10/2009 | Wang et al. | 361/752 |
| 2011/0221980 A1* | 9/2011 | Kawabata et al. | 348/794 |
| 2011/0222218 A1* | 9/2011 | Kim et al. | 361/679.01 |
| 2014/0055699 A1* | 2/2014 | Yu et al. | 349/42 |
| 2014/0055708 A1* | 2/2014 | Yu et al. | 349/58 |
| 2014/0055709 A1* | 2/2014 | Yu et al. | 349/58 |
| 2014/0055710 A1* | 2/2014 | Yu et al. | 349/58 |
| 2014/0055711 A1* | 2/2014 | Gu et al. | 349/58 |
| 2014/0055916 A1* | 2/2014 | Gu et al. | 361/679.01 |
| 2014/0055918 A1* | 2/2014 | Gu et al. | 361/679.01 |
| 2014/0055919 A1* | 2/2014 | Gu et al. | 361/679.01 |
| 2014/0055975 A1* | 2/2014 | Gu et al. | 361/807 |
| 2014/0055976 A1* | 2/2014 | Gu et al. | 361/809 |

* cited by examiner

DISPLAY DEVICE

FIELD OF THE INVENTION

The present invention relates to a display device, and more particularly to a flat panel display device.

BACKGROUND OF THE INVENTION

Flat panel display devices such as a liquid crystal display device and a plasma display device are favored by users because of such advantages as being light and thin. The flat panel display device in the related technology generally includes a front cover, a rear cover matched with the front cover, and a display panel clamped between the front and rear covers, the rear cover being generally provided in the middle with a rectangular window for exposing the side of the display panel where an image is displayed. However, due to the presence of the front cover, a rim is formed at the periphery of the display panel, making the size of the display device further reduced such as to be subject to restrictions in the case of a certain display size.

SUMMARY OF THE INVENTION

The problem to be solved by the present invention is that, to provide an improved display device aiming at the above shortages in the related technology.

To achieve the above object, A display device is provided, comprising a rear cover, a display panel, a drive device, a first adhesive member, a second adhesive member, an upper end guide frame, and a lower end guide frame, the drive device being arranged in the rear cover and electrically connected to the display panel to drive the display panel; the rear cover includes a bottom wall, an upper end sidewall arranged at an upper side of the bottom wall, an upper end coupling portion extending downward from the upper end sidewall, an upper end support portion for supporting the upper end coupling portion, a lower end sidewall arranged at a lower side of the bottom wall, a lower end coupling portion extending upward from the lower end sidewall, and a lower end support portion for supporting the lower end coupling portion; the drive device is coupled at its upper end to the upper end support portion, and at its lower end to the lower end support portion; the first adhesive member bonds the upper end of the display panel to the upper end coupling portion, and the upper end guide frame is arranged between the display panel and the upper end of the drive device; the second adhesive member bonds the lower end of the display panel to the lower end guide frame, which is coupled to the lower end of the drive device.

Preferably, the upper end guide frame is bonded at one side to the first adhesive member, and coupled at the other side opposite to the one side to the upper end of the drive device.

Preferably, the upper end guide frame is in an I shape, and longitudinally arranged between the upper end of the drive device and the upper end of the display panel.

Preferably, the lower end guide frame is in an I shape, and longitudinally arranged between the lower end of the drive device and the lower end of the display panel.

Preferably, the upper end support portion is connected between the upper end coupling portion and the bottom wall, and the lower end support portion is connected between the lower end coupling portion and the bottom wall.

Preferably, the display device includes a lower veneer structure and a third adhesive member; the third adhesive member bonds the lower veneer structure to the lower end coupling portion of the rear cover, making the lower veneer structure cover and support the lower end of the display panel.

Preferably, the drive device includes a bottom cover, which includes a first coupling portion and a second coupling portion arranged at the lower end of the drive device, wherein the first coupling portion is parallel with and coupled to the lower end support portion of the rear cover, and the second coupling portion is parallel with and coupled to the lower end guide frame.

Preferably, the bottom cover includes a third coupling portion and a fourth coupling portion arranged at the upper end of the drive device, wherein the third coupling portion is parallel with and coupled to the upper end support portion of the rear cover, and the fourth coupling portion is parallel with and connected to the upper end guide frame.

Preferably, the upper end sidewall and the lower end sidewall of the rear cover extend away from the bottom wall to form an upper protection portion and a lower end protection portion, respectively.

The present invention has the following beneficial effects: Compared with the related technology, the display panel of the display device of the present invention is exposed at the front surface of the display device and bonded to the rear cover through the adhesive member, such that the front cover is not needed, thus reducing the manufacturing cost, decreasing weight and making the device further lighter and thinner.

BRIEF DESCRIPTION OF THE DRAWINGS

The present invention will further be described below with reference to drawings and embodiments.

DETAILED DESCRIPTION OF THE PREFERRED EMBODIMENT

The present invention will further be described below in detail with reference to specific embodiments and appended drawings of the description.

Figure 1:
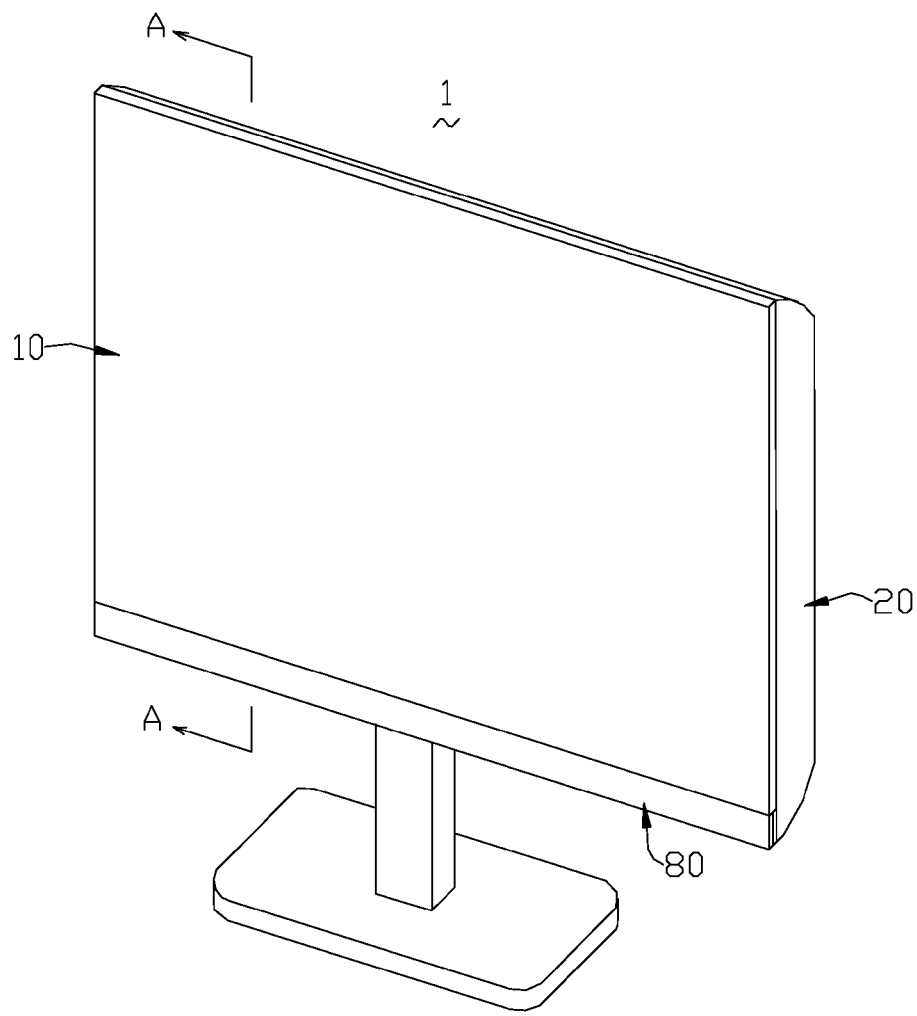
FIG. 1 is a three-dimensional schematic view of the display device according to some embodiments of the present invention.
Figure 2:
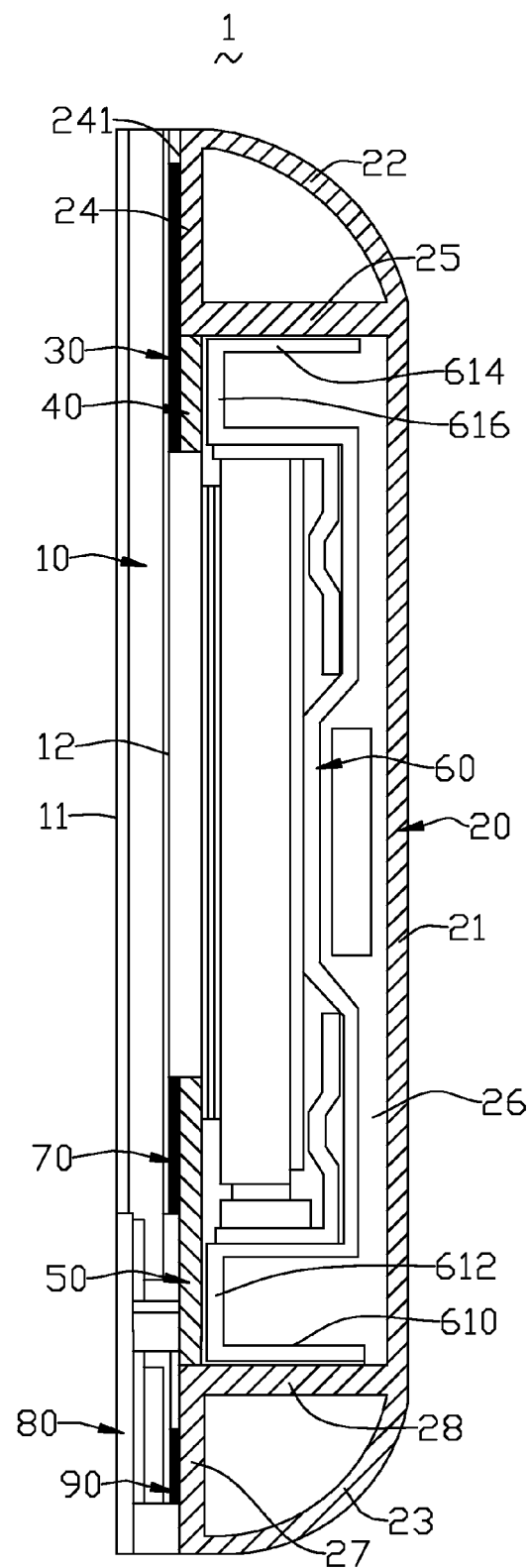
FIG. 2 is a sectional schematic view of the display device along the line A-A in FIG. 1.
Figure 3:
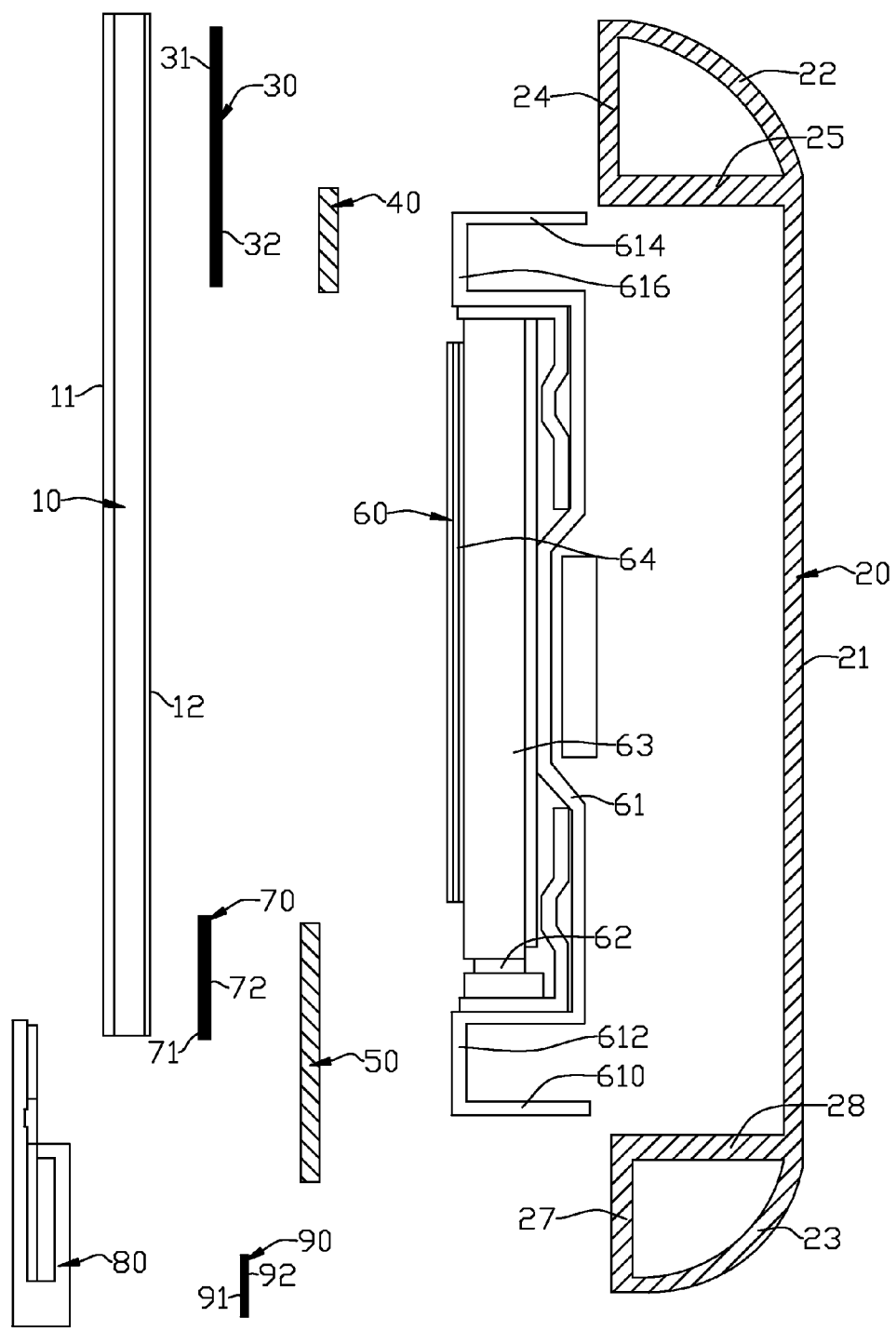
FIG. 3 is an exploded view of the display device as shown in FIG. 1.

FIG. 1 is a three-dimensional schematic view of the display device 1 according to some embodiments of the present invention. FIG. 2 is a sectional schematic view of the display device 1 along the line A-A in FIG. 1. FIG. 3 is an exploded schematic view of the display device 1 as shown in FIG. 2. The display panel 10 of the display device 1 is exposed at the front surface of the display device 1 and bonded to the rear cover 20 through the adhesive member, such that the front cover is not needed, thus reducing the manufacturing cost, decreasing weight and making the device further lighter and thinner.

As shown in FIGS. 1-3, the display device 1 in some embodiments may include a display panel 10, a rear cover 20, an adhesive member 30, an upper end guide frame 40, a lower end guide frame 50, a drive device 60, an adhesive member 70, and a lower veneer structure 80. The adhesive member 30 is bonded to the upper end of the rear cover 20, the lower end guide frame 50 is coupled to the lower end of the rear cover 20, the adhesive member 70 is bonded to the lower end guide frame 50, the upper and lower ends of the display panel 10 are bonded to the adhesive member 30 and the adhesive member 70, respectively, and the lower veneer structure 80 is coupled to the lower end guide frame 50 and covers and supports the lower end of the display panel 10. The drive device 60 is arranged in the rear cover 20, and electrically connected to the display panel 10 to drive the display panel 10.

Again as shown in FIGS. 2 and 3, the display panel 10 in some embodiments may include a front side 11 and a rear side 12 opposite to the front side 11, with the front side 11 for displaying an image. The display panel 10 may be such flat panel display panels as a liquid crystal panel or a plasma panel; when the display panel 10 is the liquid crystal panel, it is only the part in the liquid crystal display device that actually displays an image and does not include a backlight module; when the display panel 10 is the plasma panel, it is only the part in the plasma display device that actually displays an image and does not include various drive circuit boards. That is, the display panel 10 does not include various drive circuit boards or backlight modules that are applied to various flat panel display devices, and is actually only the part for displaying an image.

The rear cover 20 in some embodiments may be made of such materials as plastics and metals, and includes a bottom wall 21, an upper end sidewall 22 and a lower end sidewall 23. The bottom wall 21 may be a rectangular plate in some embodiments; both the upper end sidewall 22 and the lower end sidewall 23 may be arc-shaped plates in some embodiments, and are coupled to the upper and lower sides of the bottom wall 21, respectively, to define a receiving space 26.

The upper end of the rear cover 20 may also include an upper end coupling portion 24 and an upper end support portion 25 in some embodiments. The upper end coupling portion 24 extends out from the inner side of the top edge of the upper end sidewall 22, so as to be coupled to the upper end of the display panel 10, the upper end coupling portion 24 including a binding surface 241 opposite to the rear side of the display panel 10. The upper end support portion 25 extends horizontally to the bottom wall 21 from the end of the upper end coupling portion 24, so as to support the upper end coupling portion 24.

The lower end of the rear cover 20 may also include a lower end coupling portion 27 and a lower end support portion 28 in some embodiments. The lower end coupling portion 27, for being coupled to the lower veneer structure 80, extends upward from the inner side of the top edge of the lower end sidewall 23. The lower end support portion 28 extends horizontally to the bottom wall 21 from the end of the lower end coupling portion 27, so as to support the lower end coupling portion 27 and be coupled to the lower end guide frame 50.

The adhesive member 30 may include a surface 31 and a surface 32 opposite to the surface 31 in some embodiments, the surface 31 being bonded to the rear side 12 of the display panel 10; the surface 32 is bonded to the binding surface 241 of the upper end coupling portion 24 of the rear cover 20, thus coupling the upper end of the display panel 10 to the upper end of the rear cover 20. The adhesive member 30 may be Velcro tape or double-sided tape in some embodiments.

The upper end guide frame 40 may be in an I shape in some embodiments, which is longitudinally arranged and clamped between the display panel 10 and the drive device 60, the adhesive member 30 bonding the upper end of the display panel 10 to the upper end guide frame 40. The lower end guide frame 50 may be in an I shape in some embodiments, which is also longitudinally arranged and clamped between the display panel 10 and the drive device 60, and bonded to the lower end of the display panel 10 through the adhesive member 70.

In some embodiments, the display panel 10 is the liquid crystal panel, and correspondingly the drive device 60 is the backlight module. The drive device 60 is installed at the rear side of the display panel 10, providing backlight for the display panel 10, thus making the display panel 10 display images. The drive device 60 may include a bottom cover 61, a light source 62, a light guiding plate 63, and an optical sheet 64 in some embodiments. The light source 62 may be provided with a fluorescent lamp or a light emitting diode, and the light guiding plate 63 is in a flat plate shape so as to transmit the light from the light source 62 to the display panel 10. The optical sheet 64 is arranged on the light guiding plate 63, so as to improve the luminance characteristics of the light transmitted from the light guiding plate 63 to the display panel 10. It may be comprehended that when the display panel 10 is the plasma panel, the drive device 60 may include various printed circuit board assemblies for driving the plasma panel.

The bottom cover 61 may include in some embodiments a first coupling portion 610, a second coupling portion 612, a third coupling portion 614, and a fourth coupling portion 616. The first coupling portion 610 and the second coupling portion 612 are connected into an L shape, and arranged at the lower end of the drive device 60, wherein the first coupling portion 610 is parallel with and coupled to the lower end support portion 228 of the rear cover 20; the second coupling portion 612 is connected to the first coupling portion 610, and parallel with the lower end guide frame 50, so as to be coupled to the lower end guide frame 50. The third coupling portion 614 and the fourth coupling portion 616 are connected into an L shape, and arranged at the upper end of the drive device 60, wherein the third coupling portion 614 is parallel with the upper end support portion 25 of the rear cover 20, so as to be coupled to the upper end support portion 25; the fourth coupling portion 616 is connected to the third coupling portion 614, and parallel with the upper end guide frame 40, so as to be connected to the upper end guide frame 40.

The adhesive member 70 may be made of the same material with the adhesive member 30, and include a surface 71 and a surface 72 opposite to the surface 71 in some embodiments, the surface 71 being bonded to the rear side 12 of the display panel 10; the surface 72 is bonded to the lower end guide frame 50, thus bonding the lower end of the display panel 10 to the lower end guide frame 50.

The adhesive member 90 may be made of the same material with the adhesive member 30, and include a surface 91 and a surface 92 opposite to the surface 91 in some embodiments, the surface 91 being bonded to the rear side of the lower veneer structure 80; the surface 92 is bonded to the lower end coupling portion 27 at the lower end of the rear cover 20, thus coupling the lower veneer structure 80 to the lower end of the rear cover 20, and making the lower veneer structure 80 cover and support the lower end of the display panel 10 exposed outside.

Figure 4:
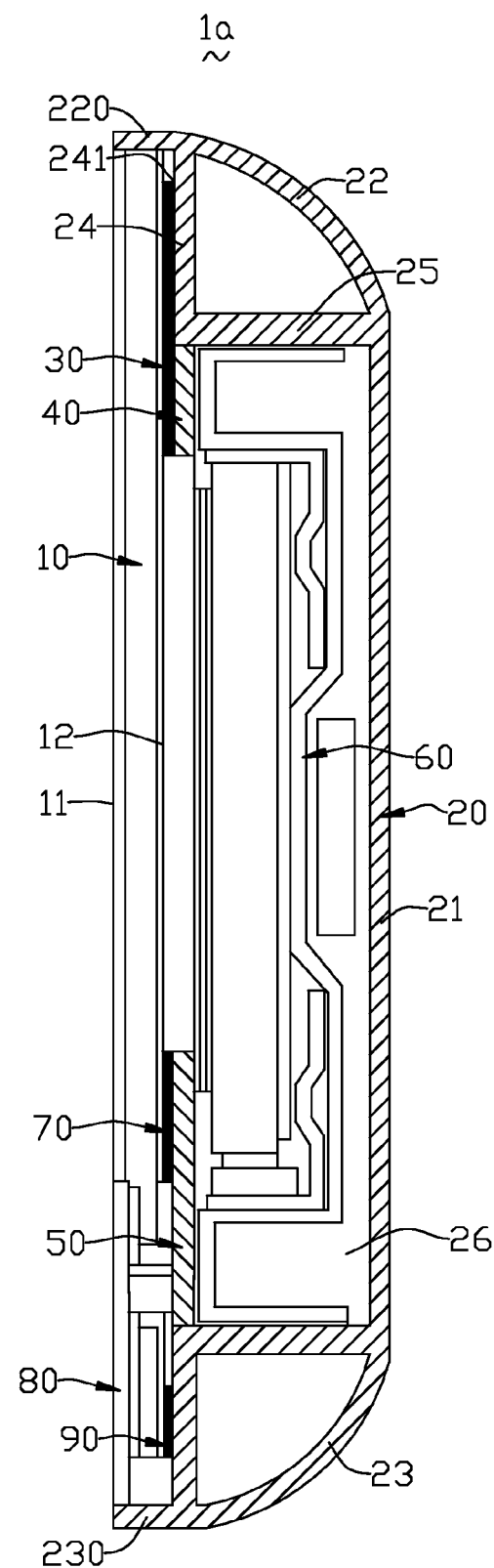
FIG. 4 is a sectional schematic view of the display device according to the other embodiment of the present invention.

The display device 1a according to the other embodiment of the present invention as shown in FIG. 4 has a similar structure to the display device 1. They are different from each other mainly in that the upper end sidewall 22 and the lower end sidewall 23 of the display device 1a extend further away from the bottom wall 22 to form an upper end protection portion 220 and a lower end protection portion 230. The upper end protection portion 220, perpendicular to the upper end coupling portion 24, is used for guiding and protecting the upper side of the display panel 10. The lower end protection portion 230, perpendicular to the lower end coupling portion 27, is used for guiding and protecting the lower side of the lower veneer structure 80. In some embodiments, the upper end protection portion 220 may be bonded to the upper side of the display panel 10 through the adhesive member, and the lower end protection portion 230 may be bonded to the lower side of the lower veneer structure 80 through the adhesive member.

What were described above are only the preferred embodiments of the present invention. The protection scope of the present invention is not limited to the above embodiments, and all the technical solutions achieved from the idea of the present invention shall fall within the protection scope of the present invention. For those of ordinary skill in the art, it should be indicated that improvements and modifications made under the premise of not departing from the principles of the present invention shall also be regarded as being within the protection scope of the invention.

What is claimed is:

1. A display device, comprising a rear cover, a display panel, a drive device, a first adhesive member, a second adhesive member, an upper end guide frame, and a lower end guide frame, the drive device being arranged in the rear cover and electrically connected to the display panel to drive the display panel, wherein, the rear cover includes a bottom wall, an upper end sidewall arranged at an upper side of the bottom wall, an upper end coupling portion extending downward from the upper end sidewall, an upper end support portion for supporting the upper end coupling portion, a lower end sidewall arranged at a lower side of the bottom wall, a lower end coupling portion extending upward from the lower end sidewall, and a lower end support portion for supporting the lower end coupling portion; the drive device is coupled at its upper end to the upper end support portion, and at its lower end to the lower end support portion; the first adhesive member bonds an upper end of the display panel to the upper end coupling portion, and the upper end guide frame is arranged between the display panel and an upper end of the drive device; the second adhesive member bonds a lower end of the display panel to the lower end guide frame, which is coupled to a lower end of the drive device.

2. The display device of claim 1, wherein, the upper end guide frame is bonded at one side to the first adhesive member, and coupled at the other side opposite to the one side to the upper end of the drive device.

3. The display device of claim 2, wherein, the upper end guide frame is in an I shape, and longitudinally arranged between the upper end of the drive device and the upper end of the display panel.

4. The display device of claim 3, wherein, the lower end guide frame is in an I shape, and longitudinally arranged between the lower end of the drive device and the lower end of the display panel.

5. The display device of claim 1, wherein, the upper end support portion is connected between the upper end coupling portion and the bottom wall, and the lower end support portion is connected between the lower end coupling portion and the bottom wall.

6. The display device of claim 1, wherein, the display device includes a lower veneer structure and a third adhesive member; the third adhesive member bonds the lower veneer structure to the lower end coupling portion of the rear cover, making the lower veneer structure cover and support the lower end of the display panel.

7. The display device of claim 1, wherein, the drive device includes a bottom cover, a first coupling portion and a second coupling portion, the bottom cover including the first coupling portion and the second coupling portion arranged at the lower end of the drive device, wherein the first coupling portion is parallel with and coupled to the lower end support portion of the rear cover; the second coupling portion is parallel with and coupled to the lower end guide frame.

8. The display device of claim 7, wherein, the bottom cover includes a third coupling portion and a fourth coupling portion arranged at the upper end of the drive device, wherein the third coupling portion is parallel with and coupled to the upper end support portion of the rear cover, and the fourth coupling portion is parallel with and connected to the upper end guide frame.

9. The display device of claim 1, wherein, the bottom cover includes a third coupling portion and a fourth coupling portion arranged at the upper end of the drive device, wherein the third coupling portion is parallel with and coupled to the upper end support portion of the rear cover, and the fourth coupling portion is parallel with and connected to the upper end guide frame.

10. The display device of claim 1, wherein, the upper end sidewall and the lower end sidewall of the rear cover extend away from the bottom wall to form an upper protection portion and a lower end protection portion, respectively.

11. The display device of claim 2, wherein, the upper end support portion is connected between the upper end coupling portion and the bottom wall, and the lower end support portion is connected between the lower end coupling portion and the bottom wall.

12. The display device of claim 3, wherein, the upper end support portion is connected between the upper end coupling portion and the bottom wall, and the lower end support portion is connected between the lower end coupling portion and the bottom wall.

13. The display device of claim 4, wherein, the upper end support portion is connected between the upper end coupling portion and the bottom wall, and the lower end support portion is connected between the lower end coupling portion and the bottom wall.

14. The display device of claim 2, wherein, the display device includes a lower veneer structure and a third adhesive member; the third adhesive member bonds the lower veneer structure to the lower end coupling portion of the rear cover, making the lower veneer structure cover and support the lower end of the display panel.

15. The display device of claim 3, wherein, the display device includes a lower veneer structure and a third adhesive member; the third adhesive member bonds the lower veneer structure to the lower end coupling portion of the rear cover, making the lower veneer structure cover and support the lower end of the display panel.

16. The display device of claim 4, wherein, the display device includes a lower veneer structure and a third adhesive member; the third adhesive member bonds the lower veneer structure to the lower end coupling portion of the rear cover, making the lower veneer structure cover and support the lower end of the display panel.

17. The display device of claim 2, wherein, the drive device includes a bottom cover, a first coupling portion and a second coupling portion, the bottom cover including the first coupling portion and the second coupling portion arranged at the lower end of the drive device, wherein the first coupling portion is parallel with and coupled to the lower end support portion of the rear cover; the second coupling portion is parallel with and coupled to the lower end guide frame.

18. The display device of claim 3, wherein, the drive device includes a bottom cover, a first coupling portion and a second coupling portion, the bottom cover including the first coupling portion and the second coupling portion arranged at the lower end of the drive device, wherein the first coupling portion is parallel with and coupled to the lower end support portion of the rear cover; the second coupling portion is parallel with and coupled to the lower end guide frame.

19. The display device of claim 4, wherein, the drive device includes a bottom cover, a first coupling portion and a second coupling portion, the bottom cover including the first coupling portion and the second coupling portion arranged at the lower end of the drive device, wherein the first coupling portion is parallel with and coupled to the lower end support portion of the rear cover; the second coupling portion is parallel with and coupled to the lower end guide frame.

20. The display device of claim 2, wherein, the bottom cover includes a third coupling portion and a fourth coupling portion arranged at the upper end of the drive device, wherein the third coupling portion is parallel with and coupled to the upper end support portion of the rear cover, and the fourth coupling portion is parallel with and connected to the upper end guide frame.

* * * * *